United States Patent
Fujimoto et al.

(10) Patent No.: US 11,383,274 B2
(45) Date of Patent: Jul. 12, 2022

(54) VIBRATION DEVICE AND IMAGING UNIT INCLUDING VIBRATION DEVICE

(71) Applicant: Murata Manufacturing Co., Ltd., Nagaokakyo (JP)

(72) Inventors: Katsumi Fujimoto, Nagaokakyo (JP); Yuuki Ishii, Nagaokakyo (JP); Hitoshi Sakaguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 11 days.

(21) Appl. No.: 17/137,503

(22) Filed: Dec. 30, 2020

(65) Prior Publication Data

US 2021/0154701 A1    May 27, 2021

Related U.S. Application Data

(63) Continuation of application No. PCT/JP2020/023503, filed on Jun. 16, 2020.

(30) Foreign Application Priority Data

Nov. 22, 2019    (JP) .............................. JP2019-211262

(51) Int. Cl.
*B06B 1/06*    (2006.01)
*G02B 7/02*    (2021.01)
(Continued)

(52) U.S. Cl.
CPC .......... *B06B 1/0655* (2013.01); *B06B 1/0207* (2013.01); *G02B 7/02* (2013.01);
(Continued)

(58) Field of Classification Search
CPC ... B06B 1/0207; B06B 1/0625; B06B 1/0655; G02B 27/0006; G02B 7/02; G02B 7/026;
(Continued)

(56) References Cited

U.S. PATENT DOCUMENTS

2007/0183771 A1* 8/2007 Takanashi .............. G03B 17/02
396/429
2009/0262232 A1* 10/2009 Kim ....................... G02B 7/102
348/340

(Continued)

FOREIGN PATENT DOCUMENTS

JP          6579200 B2    9/2019
KR    10-2013-0032136 A    4/2013
(Continued)

OTHER PUBLICATIONS

Official Communication issued in International Patent Application No. PCT/JP2020/023503, dated Sep. 8, 2020.
(Continued)

*Primary Examiner* — Amy R Hsu
(74) *Attorney, Agent, or Firm* — Keating & Bennett, LLP

(57) ABSTRACT

A vibration device includes a protective cover that transmits light with a predetermined wavelength, a first cylindrical body that holds the protective cover at one end, a plate-shaped plate spring that supports the other end of the first cylindrical body, a second cylindrical body that supports, at one end, a portion of the plate spring in an outer side portion of a portion that supports the first cylindrical body, and a plurality of piezoelectric elements on side surfaces of the second cylindrical body and that vibrates in a direction perpendicular to a penetrating direction of the second cylindrical body.

20 Claims, 7 Drawing Sheets

(51) Int. Cl.
    *G03B 17/02* (2021.01)
    *B06B 1/02* (2006.01)
    *H04N 5/225* (2006.01)
    *H01L 41/09* (2006.01)
    *G03B 17/56* (2021.01)
(52) U.S. Cl.
    CPC ............. *G03B 17/02* (2013.01); *G03B 17/56* (2013.01); *H01L 41/0926* (2013.01); *H04N 5/2251* (2013.01)
(58) Field of Classification Search
    CPC ........ G03B 17/02; G03B 17/08; G03B 17/56; G03B 30/00; H01L 41/09; H04N 5/2251; H04N 5/22521
    See application file for complete search history.

(56) References Cited

U.S. PATENT DOCUMENTS

| | | | | |
|---|---|---|---|---|
| 2010/0085474 A1* | 4/2010 | Morita | ................. | H04N 5/2251 348/374 |
| 2015/0277140 A1* | 10/2015 | Minamisawa | ........... | G03B 5/06 359/557 |
| 2016/0313568 A1* | 10/2016 | Ichihashi | ................. | G02B 7/08 |
| 2017/0046818 A1* | 2/2017 | Kiyamura | ............ | G02B 27/646 |
| 2018/0210194 A1 | 7/2018 | Nishiyama et al. | | |
| 2018/0217348 A1* | 8/2018 | Han | ...................... | H04N 5/2257 |
| 2018/0239218 A1 | 8/2018 | Ikeuchi et al. | | |
| 2019/0113744 A1* | 4/2019 | Magee | .................... | B08B 7/026 |
| 2019/0176195 A1 | 6/2019 | Fujimoto et al. | | |
| 2019/0204533 A1* | 7/2019 | Kaneko | .................... | G02B 7/04 |
| 2019/0297237 A1* | 9/2019 | Lee | ......................... | G02B 7/105 |
| 2020/0038914 A1* | 2/2020 | Fujimoto | ............... | G03B 17/08 |
| 2020/0055087 A1 | 2/2020 | Fujimoto et al. | | |

FOREIGN PATENT DOCUMENTS

| | | |
|---|---|---|
| WO | 2017/110563 A1 | 6/2017 |
| WO | 2018/100795 A1 | 6/2018 |
| WO | 2018/207395 A1 | 11/2018 |

OTHER PUBLICATIONS

Official Communication issued in corresponding Chinese Patent Application No. 202080005606.8, dated Jan. 17, 2022.

* cited by examiner

VIBRATION DEVICE AND IMAGING UNIT INCLUDING VIBRATION DEVICE

CROSS REFERENCE TO RELATED APPLICATIONS

This application claims the benefit of priority to Japanese Patent Application No. 2019-211262 filed on Nov. 22, 2019 and is a Continuation Application of PCT Application No. PCT/JP2020/023503 filed on Jun. 16, 2020. The entire contents of each application are hereby incorporated herein by reference.

BACKGROUND OF THE INVENTION

1. Field of the Invention

The present disclosure relates to a vibration device and an imaging unit including the vibration device.

2. Description of the Related Art

In recent years, in a vehicle equipped with an imaging unit including an imaging element or the like in a front portion or a rear portion of a vehicle, a safety device is controlled by using an image obtained by the imaging unit, or an automatic driving control is performed. Since such an imaging unit is often provided outside a vehicle, foreign matter, such as raindrops (water droplets), mud, dust, and the like, may adhere to a light transmissive body (a protective cover or a lens) that covers an exterior of the imaging unit. When the foreign matter adheres to the light transmissive body, the attached foreign matter is reflected on the image obtained by the imaging unit, and a sharp image cannot be obtained.

Therefore, an imaging unit described in Japanese Patent No. 6579200 is provided with a vibration device for vibrating a light transmissive body in order to remove foreign matter adhering to a surface of the light transmissive body. The vibration device includes a support body, a first vibration element arranged on one main surface side of the support body, and a second vibration element arranged on the other main surface side. The vibration device vibrates a second vibrating body provided with a piezoelectric vibrator to thereby vibrate a first vibrating body having a light-transmitting property, and thus removes foreign matter adhering to the surface of the light transmissive body.

In addition, an imaging unit described in International Publication No. WO2017/110563 includes, in order to vibrate a lens cover that covers one cavity of a cylindrical vibrating body, a vibration device in which a cylindrical mode conversion coupling portion is provided between a cylindrical vibrating body and a light transmissive body portion of the lens cover.

The imaging units described in Japanese Patent No. 6579200 and International Publication No. WO2017/110563 are based on the premise that the vibration device using a vibration mode for displacing an in-plane portion of the light transmissive body is provided. Therefore, in the imaging units described in Japanese Patent No. 6579200 and International Publication No. WO2017/110563, the light transmissive body is vibrated by using the vibration device so that an in-plane portion of the light transmissive body differs in displacement from another portion. Specifically, when vibrating the light transmissive body in a certain vibration mode, the vibration device vibrates the light transmissive body so that a central portion of the light transmissive body has a maximum displacement.

In a case where the central portion of the light transmissive body is vibrated so as to have the maximum displacement, the vibration device can move the raindrops adhering to the surface of the light transmissive body to the central portion of the light transmissive body and atomize the raindrops. That is, since a position where the displacement of the light transmissive body is large becomes hydrophilic by causing the vibration device to vibrate the light transmissive body, it is possible to move the raindrop at a position where the displacement is small to a position where the displacement is large by a surface tension difference. However, an amount of raindrops that can be moved by vibrating the light transmissive body by the vibration device depends on the distance from the position of the maximum displacement and a magnitude of the maximum displacement, and an ability to remove raindrops (foreign matter) greatly changes depending on the vibration mode of the vibration device. Further, the vibration device collects raindrops (foreign matter) at the position of the light transmissive body having the maximum displacement, and thus there has been a concern that the field of view at the position may be obstructed until the collected raindrop (foreign matter) is atomized.

SUMMARY OF THE INVENTION

Preferred embodiments of the present invention provide vibration devices that are each capable of removing foreign matter adhering to a light transmissive body while maintaining a field of view of the light transmissive body, and imaging units each including a vibration device.

A vibration device according to a preferred embodiment of the present disclosure includes a light transmissive body that transmits light with a predetermined wavelength, a first cylindrical body that holds the light transmissive body at one end, a plate-shaped spring portion that supports another end of the first cylindrical body, a second cylindrical body that supports, at one end, a position of the spring portion in an outer side portion of a position that supports the first cylindrical body, and a plurality of vibrating bodies disposed on side surfaces of the second cylindrical body and vibrating in a direction perpendicular or substantially perpendicular to an axial direction of the second cylindrical body.

An imaging unit according to a preferred embodiment of the present disclosure includes a vibration device according to a preferred embodiment of the present invention and an imaging element arranged so that the light transmissive body is in a field of view of the imaging element.

According to preferred embodiments of the present invention, vibration devices and imaging units each including a vibration device are able to remove foreign matter adhering to a light transmissive body while maintaining the field of view of the light transmissive body.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
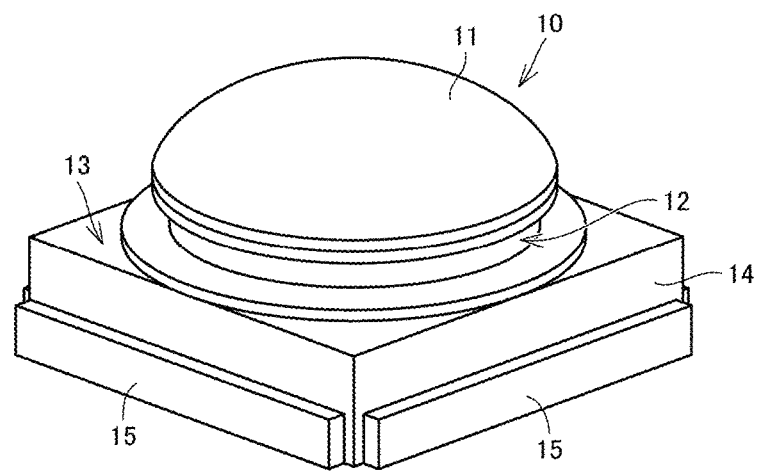
FIG. 1 is a perspective view of a vibration device according to Preferred Embodiment 1 of the present invention.

Hereinafter, vibration devices and imaging units including the vibration device according to preferred embodiments will be described in detail with reference to the drawings. Note that the same reference numerals in the drawings denote the same or corresponding elements and portions.

Preferred Embodiment 1

A vibration device and an imaging unit including the vibration device according to Preferred Embodiment 1 of the present invention will be described with reference to the drawings. FIG. 1 is a perspective view of a vibration device 10 according to Preferred Embodiment 1. The vibration device 10 includes a protective cover 11, a first cylindrical body 12, a plate spring 13, a second cylindrical body 14, and a piezoelectric element 15.

The protective cover 11 preferably has a dome shape. The protective cover 11 includes a transparent member as a light transmissive body that transmits light having a predetermined wavelength. An end portion of the protective cover 11 is held by an end portion of the first cylindrical body 12 having a cylindrical or substantially cylindrical shape. The first cylindrical body 12 is supported by the plate spring 13 that elastically deforms on a side opposite to the protective cover 11 side. The plate spring 13 supports a bottom surface of the cylindrical first cylindrical body 12, and extends outward from the supported position. The plate spring 13 surrounds a circumference of the first cylindrical body 12 in a rectangular or substantially rectangular shape.

The plate spring 13 is supported by the second cylindrical body 14 at a position on an outer side portion of a position that supports the first cylindrical body 12. The second cylindrical body 14 has a rectangular or substantially rectangular cylindrical shape. The piezoelectric element 15 having a rectangular or substantially rectangular shape is disposed on each of four side surfaces of the second cylindrical body 14. The piezoelectric element 15 is a vibrating body that vibrates in a direction (a horizontal or substantially horizontal direction or a longitudinal direction in the figure) perpendicular to an axial direction (a vertical direction in FIG. 1) of the second cylindrical body 14. The piezoelectric element 15 may be disposed only on two surfaces facing each other, instead of being disposed on the four side surfaces of the second cylindrical body 14.

The first cylindrical body 12, the plate spring 13, and the second cylindrical body 14 are integrally provided. The first cylindrical body 12, the plate spring 13, and the second cylindrical body 14 are preferably made of, for example, a metal or a synthetic resin. Note that the first cylindrical body 12, the plate spring 13, and the second cylindrical body 14 may be separately provided, or may be defined by separate members. A method of joining the protective cover 11 and the first cylindrical body 12 is not particularly limited. The protective cover 11 and the first cylindrical body 12 may be joined to each other by an adhesive, welding, fitting, press-fitting, or the like, for example.

In Preferred Embodiment 1, the protective cover 11 is preferably made of glass, for example. However, the protective cover 11 is not limited to glass, and may be made of a resin such as a transparent plastic, for example. Alternatively, the protective cover 11 may be made of a light transmissive ceramic material, for example. However, depending on the application, it is preferable to use tempered glass, such that the strength can be increased. In the case of the resin, the protective cover 11 may be an acrylic, a cycloolefin, a polycarbonate, a polyester, or the like, for example. Further, the protective cover 11 may include a coating layer made of DLC or the like, for example, provided on the surface thereof to increase the strength, and a coating layer such as a hydrophilic film, a water-repellent film, a lipophilic film, an oil-repellent film, and the like, for example, may be included to prevent contamination of the surface, removal of raindrops, and the like.

The dome shape of the protective cover 11 is not limited to a hemispherical shape. A shape obtained by connecting a cylinder to a hemisphere, a curved shape smaller than the hemisphere, or the like, for example, may be included. The protective cover 11 may be a flat plate. It does not matter whether the light transmitted through the protective cover 11 is visible light or invisible light. The protective cover 11 may be a cover made of glass, or may be made of an optical component such as a concave lens, a convex lens, or a flat lens, for example.

The piezoelectric element 15 vibrates, for example, by polarizing in a thickness direction. The piezoelectric element 15 is preferably made of lead zirconate titanate-based piezoelectric ceramics. However, other piezoelectric ceramics, such as (K, Na) NbO$_3$, for example, may be used. Further, a piezoelectric single crystal, such as LiTaO$_3$, for example, may be used.

Figure 2:
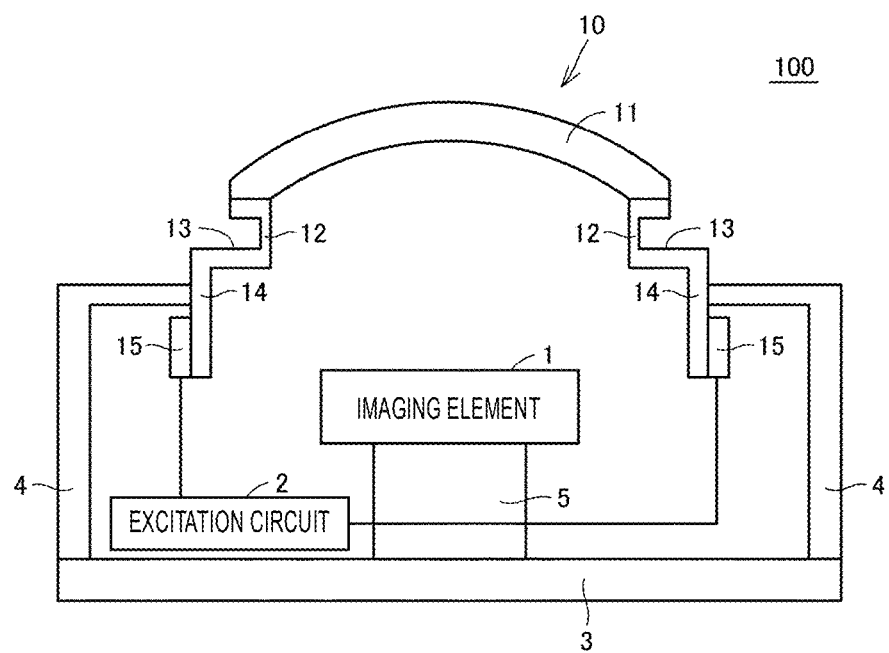
FIG. 2 is a schematic diagram of a configuration of an imaging unit according to Preferred Embodiment 1 of the present invention.

FIG. 2 is a schematic diagram for explaining a configuration of an imaging unit 100 according to Preferred Embodiment 1. FIG. 2 is a sectional view of the vibration device 10 in which the vibration device 10 of FIG. 1 is cut at the center in a direction perpendicular or substantially perpendicular to the side surface of the second cylindrical body 14 with respect to the protective cover 11. The imaging unit 100 is attached, for example, on a front side, a rear side, or the like of a vehicle, and images an object to be imaged. Note that a location where the imaging unit 100 is attached is not limited to the vehicle, and may be attached to another device such as a ship, an airplane, or the like, for example.

The imaging unit 100 includes the vibration device 10 and a camera 1 as an imaging element housed in the vibration device 10. The camera 1 is fixed to an upper end portion of a main body member 5 fixed to a base member 3. The vibration device 10 is supported by a support member 4 fixed to the base member 3.

In a case where the imaging unit 100 is attached to a vehicle or the like and is used outdoors, foreign matter, such as raindrops, mud, dust, and the like, for example, may adhere to the protective cover 11 that is arranged in a visual field of the camera 1 and covers an exterior thereof. The vibration device 10 can generate a vibration to remove foreign matter, such as raindrops or the like, for example, adhering to the protective cover 11.

The vibration device 10 includes an excitation circuit 2 that transmits a signal to generate a vibration. The excitation circuit 2 is connected to the piezoelectric element 15 that is driven as a plurality of vibrating bodies. The piezoelectric element 15 vibrates the second cylindrical body 14 based on a signal from the excitation circuit 2. Vibration to the second cylindrical body 14 causes the first cylindrical body 12 to vibrate. In the vibration device 10, the first cylindrical body 12 is vibrated to vibrate the protective cover 11, thus removing foreign matter, such as raindrops or the like, for example, adhering to the protective cover 11.

The excitation circuit 2 drives the plurality of piezoelectric elements 15 so that a timing to vibrate the second cylindrical body 14 in the inward direction is in phase, and vibrates the first cylindrical body 12 in the axial direction.

As illustrated in FIG. 2, a thickness of the first cylindrical body 12 is thinner than a thickness of the plate spring 13 and the second cylindrical body 14. The thickness of the first cylindrical body 12 is shorter than a length from a position of the plate spring 13 supporting the first cylindrical body 12 to a position of the plate spring 13 supported by the second cylindrical body 14.

Figure 3A:
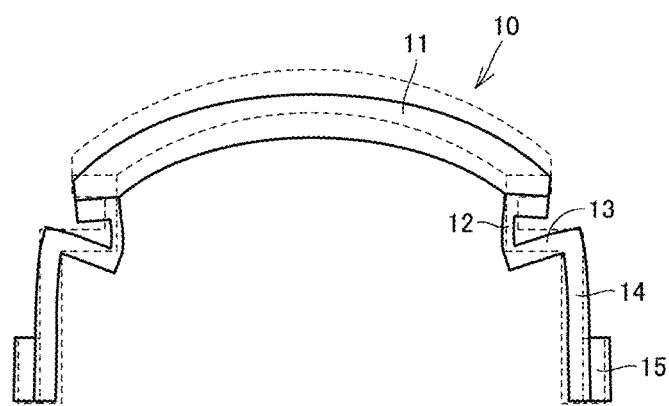
FIGS. 3A and 3B include diagrams for explaining vibration of the vibration device according to Preferred Embodiment 1 of the present invention.
Figure 3B:
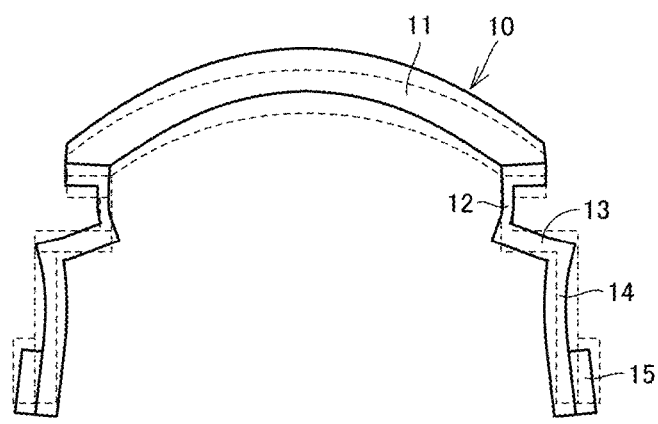

FIGS. 3A and 3B includes diagrams for explaining vibration of the vibration device 10 according to Preferred Embodiment 1. FIG. 3A illustrates a case where the vibration device 10 resonates in a vibration mode (piston vibration mode) in which the first cylindrical body 12 is displaced substantially uniformly by the vibration of the piezoelectric element 15. The piston vibration mode is also referred to as a plate spring vibration mode. FIG. 3B illustrates a case where the vibration device 10 resonates in a vibration mode (hereinafter, also referred to as a protective cover vibration mode) in which a central portion of the protective cover 11 has the maximum displacement by the vibration of the piezoelectric element 15. In FIGS. 3A and 3B, a reference position of the vibration device 10 before the start of the vibration is indicated by a broken line, and a position of the vibration device 10 after the displacement is indicated by a solid line.

In FIG. 3A, the vibration device 10 vibrates the piezoelectric elements 15 provided on the side surfaces facing each other in an inward direction or an outward direction to or from each other. In the vibration device 10, when the piezoelectric elements 15 vibrate in the outward direction from each other, the second cylindrical body 14 is displaced in the outward direction, and the position of the plate spring 13 supporting the first cylindrical body 12 sinks downward. When the position of the plate spring 13 sinks downward, the entirety of the first cylindrical body 12 is displaced downward, and the protective cover 11 held by the first cylindrical body 12 is also entirely displaced downward.

Although not illustrated, when the piezoelectric elements 15 vibrate in the inward direction to each other, the second cylindrical body 14 is displaced in the inward direction, and the position of the plate spring 13 supporting the first cylindrical body 12 rises upward. When the position of the plate spring 13 rises upward, the entirety of the first cylindrical body 12 is displaced upward, and the protective cover 11 held by the first cylindrical body 12 is also entirely displaced upward. Therefore, the entirety of the protective cover 11 is uniformly displaced in the vertical direction without substantially deforming the protective cover 11 itself due to the vibration of the piezoelectric element 15.

FIG. 3B illustrates vibration that occurs at a higher frequency than that in FIG. 3A. When the piezoelectric elements 15 vibrate in the inward direction to each other at a frequency higher than that in FIG. 3A, the second cylindrical body 14 is displaced in the inward direction, which causes the first cylindrical body 12 to be displaced inward through the plate spring 13. By displacing the first cylindrical body 12 inward, both ends of the protective cover 11 are displaced inward. When both ends of the protective cover 11 are displaced inward, the protective cover 11 vibrates so that the central portion of the protective cover 11 has the maximum displacement in an upward direction.

Although not illustrated, when the piezoelectric elements 15 vibrate in the outward direction from each other, the second cylindrical body 14 is displaced in the outward direction, which causes the first cylindrical body 12 to be displaced outward through the plate spring 13. By displacing the first cylindrical body 12 outward, both ends of the protective cover 11 are displaced outward. When both ends of the protective cover 11 are displaced outward, the protective cover 11 vibrates so that the central portion of the protective cover 11 has the maximum displacement in the downward direction. Therefore, the protective cover 11 vibrates so that the central portion of the protective cover 11 has the maximum displacement by vibrating the piezoelectric element 15.

As illustrated in FIGS. 3A and 3B, the vibration mode can be changed by changing a vibration frequency of the piezoelectric element 15. That is, the vibration device 10 is capable of performing vibration in a plurality of different vibration modes (for example, two vibration modes) by the excitation frequency. Here, the frequency at which the vibration device 10 is excited can be adjusted by changing the frequency of the drive signal to be applied to the piezoelectric element 15.

Figure 4:
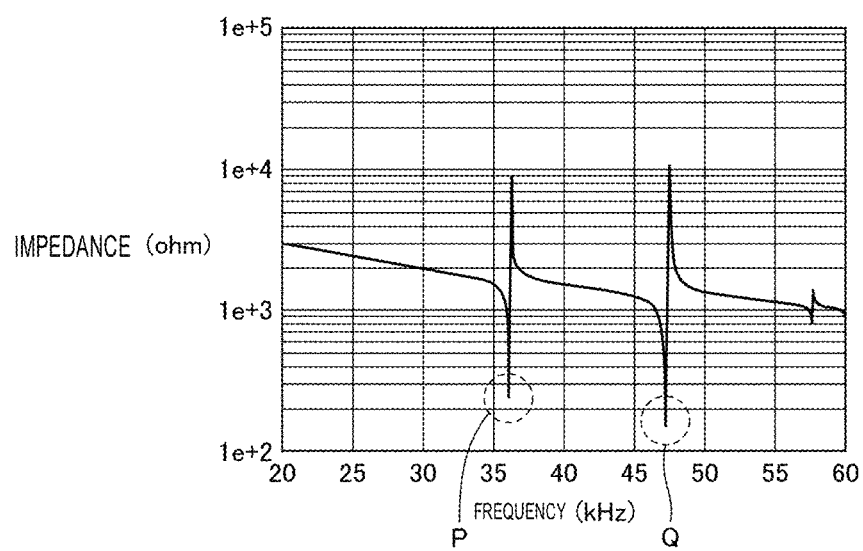
FIG. 4 is a diagram illustrating a relationship between a frequency and an impedance of a drive signal to be applied to a piezoelectric element in the vibration device according to Preferred Embodiment 1 of the present invention.

FIG. 4 is a diagram illustrating a relationship between the frequency and the impedance of the drive signal to be applied to the piezoelectric element 15 in the vibration device 10 according to Preferred Embodiment 1. As can be seen from a portion indicated by a position P in FIG. 4, the impedance of the piezoelectric element 15 largely changes around about 36 kHz of the resonant frequency of the piezoelectric element 15. The position P indicates the frequency of the drive signal to vibrate the protective cover 11 in the piston vibration mode as illustrated in FIG. 3A described above. As can be seen from a portion indicated by a position Q in FIG. 4, the impedance of the piezoelectric element 15 largely changes around about 47 kHz of the resonant frequency of the piezoelectric element 15, which is higher than the frequency of the position P. The position Q indicates the frequency of the drive signal of the vibration in which the central portion of the protective cover 11 has the maximum displacement as illustrated in FIG. 3B described above.

As illustrated in FIG. 4, the vibration device 10 can change the vibration mode of the vibration device 10 by the frequency of the drive signal to be applied to the piezoelectric element 15. The resonant frequency of the piston vibration mode is about 36 kHz, whereas the resonant frequency of the protective cover vibration mode is about 47 kHz, which is higher. However, when the resonant frequency of the piston vibration mode is close to the resonant frequency of the protective cover vibration mode, the vibration device 10 cannot vibrate the protective cover 11 only in the piston vibration mode. Here, the relationship between the resonant frequency of the piston vibration mode and the resonant frequency of the protective cover vibration mode varies depending on the structure of the vibration device 10. In particular, the relationship between the resonant frequency of the piston vibration mode and the resonant frequency of the protective cover vibration mode varies greatly depending on the thickness of the protective cover 11.

Figure 5:
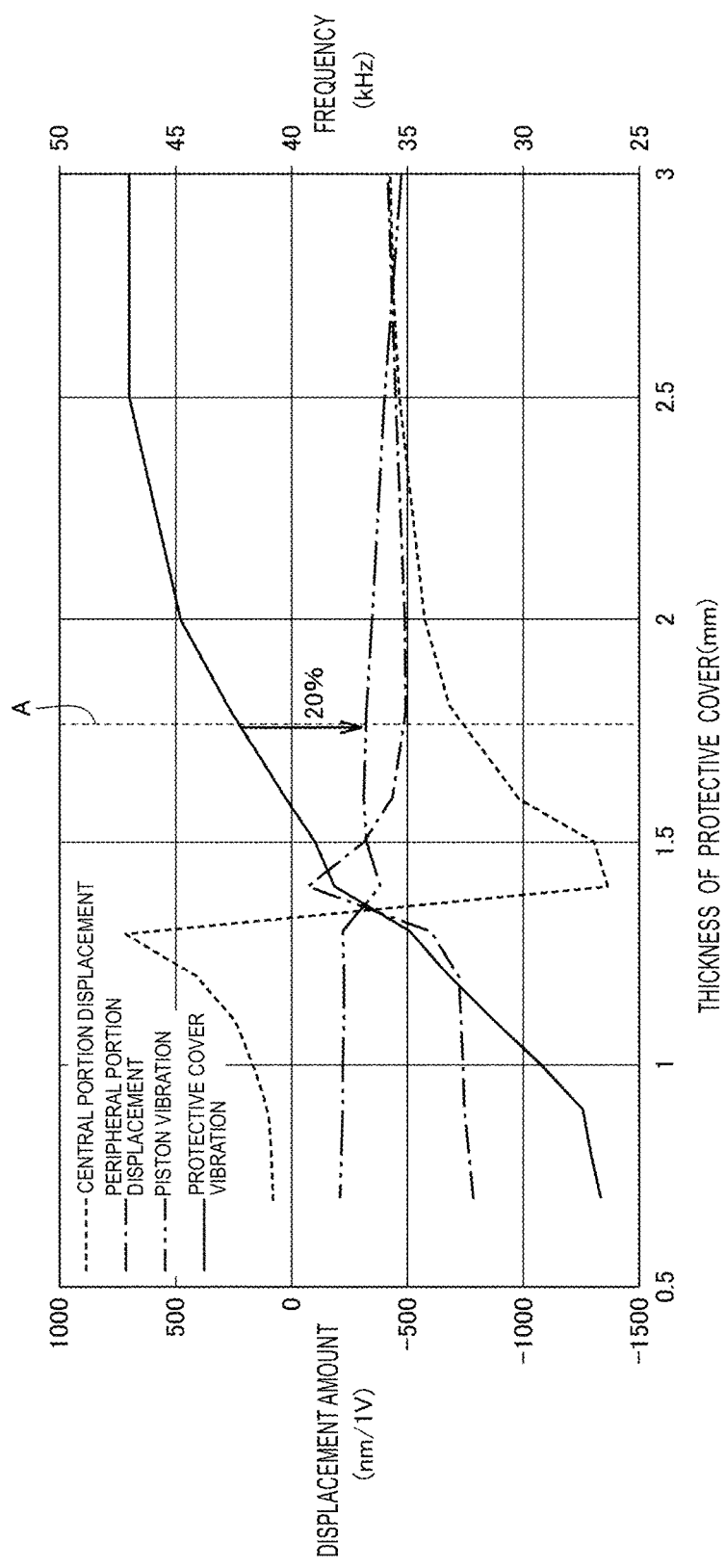
FIG. 5 is a graph showing a relationship between a resonant frequency of a piston vibration mode and a resonant frequency of a protective cover vibration mode depending on a change in thickness of a protective cover according to Preferred Embodiment 1 of the present invention.

FIG. 5 is a graph showing a relationship between the resonant frequency of the piston vibration mode and the resonant frequency of the protective cover vibration mode depending on the change in the thickness of the protective cover 11 according to Preferred Embodiment 1. In FIG. 5, the resonant frequency of the plate spring vibration by the piston vibration mode at the position P in FIG. 4 and the resonant frequency of the protective cover vibration by the protective cover mode at the position Q are plotted. FIG. 5 shows a change in displacement of the central portion and a change in displacement of the peripheral portion of the protective cover 11 in a case where the thickness of the protective cover 11 is changed regarding the shape thereof as a flat plate not as a dome shape and the vibration device 10 is vibrated at the resonant frequency of the piston vibration mode. As can been seen from FIG. 5, the resonant frequency of the piston vibration mode gradually decreases as the thickness of the protective cover 11 increases. On the other hand, the resonant frequency of the protective cover vibration mode increases as the thickness of the protective cover 11 increases.

When the thickness of the protective cover 11 is about 1.35 mm, for example, the resonant frequency of the protective cover vibration mode is substantially the same as the resonant frequency of the piston vibration mode. That is, when the protective cover 11 has a thickness of about 1.35 mm, the vibration device 10 cannot perform driving by separating the protective cover vibration mode and the piston vibration mode from each other. Before and after the point at which the resonant frequencies are the same or approximately the same, the displacement of the central portion of the protective cover 11, which increases along with the thickness of the protective cover 11, sharply decreases. Further, before and after this point, the displacement of the peripheral portion of the protective cover 11, which gradually increases along with the thickness of the protective cover 11, sharply increases. In a region where the thickness of the protective cover 11 is thicker than about 1.35 mm, the resonant frequency of the protective cover vibration mode has a higher value than the resonant frequency of the piston vibration mode. Note that, in the above-described example, the thickness of the protective cover 11 is changed to make the resonant frequency of the protective cover vibration mode be larger than the resonant frequency of the piston vibration mode. However, the protective cover 11, the first cylindrical body 12, the plate spring 13, and the second cylindrical body 14 may be configured so that the resonant frequency of the protective cover vibration mode is larger than the resonant frequency of the piston vibration mode.

As can be seen from FIG. 5, in a region where the resonant frequency of the protective cover vibration mode is higher than the resonant frequency of the piston vibration mode, the displacement of the central portion and the displacement of the peripheral portion of the protective cover 11 converge to the same or substantially the same displacement, and the entirety of the protective cover 11 is displaced. That is, in the region, the vibration device 10 can vibrate the protective cover 11 in the piston vibration mode as illustrated in FIG. 3A. In particular, in a region on the right side of a broken line A in FIG. 5, the amount of displacement per unit voltage of the central portion displacement and the peripheral portion displacement of the protective cover 11 converges around −500 (nm/1V). The thickness of the protective cover 11 of the broken line A is about 1.75 mm. Further, the resonant frequency of the protective cover vibration mode on the broken line A is about 1.2 times the resonant frequency of the piston vibration mode. In a case where the resonant frequency of the protective cover vibration mode is equal to or more than about 1.2 times the resonant frequency of the piston vibration mode, the vibration device 10 can vibrate the protective cover 11 in the piston vibration mode. In the region on the right side of the broken line A, since the resonant frequency of the protective cover vibration mode is equal to or more than about 1.2 times the resonant frequency of the piston vibration mode, the vibration device 10 makes it easy to vibrate the protective cover 11 in the piston vibration mode. Note that, in the above-described example, it is configured such that the thickness of the protective cover 11 is changed to make the resonant frequency of the protective cover vibration mode be 1.2 times the resonant frequency of the piston vibration mode, however, the protective cover 11, the first cylindrical body 12, the plate spring 13, and the second cylindrical body 14 may be configured so that the resonant frequency of the protective cover vibration mode is 1.2 times the resonant frequency of the piston vibration mode.

As illustrated in FIG. 5, when the thickness of the protective cover 11 is equal to or more than about 2.5 mm, the displacement of the central portion and the displacement of the peripheral portion of the protective cover 11 have the same or substantially the same displacement difference. At this time, the resonant frequency of the protective cover vibration mode is about 1.3 times the resonant frequency of the piston vibration mode.

As described above, the vibration device 10 according to Preferred Embodiment 1 includes the protective cover 11 that transmits light with a predetermined wavelength, the first cylindrical body 12 that holds the protective cover 11 at one end, the plate-shaped plate spring 13 that supports the other end of the first cylindrical body 12, the second cylindrical body 14 that supports, at one end, a position of the plate spring 13 in an outer side portion of a position that supports the first cylindrical body 12, and the plurality of piezoelectric elements 15 that is disposed on the side surfaces of the second cylindrical body 14 and vibrates in a direction perpendicular or substantially perpendicular to the axial direction of the second cylindrical body 14.

Accordingly, the vibration device 10 according to Preferred Embodiment 1 can vibrate the protective cover 11 in the piston vibration mode, and therefore, the foreign matter adhering to the protective cover 11 can be removed while maintaining the field of view of the protective cover 11.

The vibration device 10 includes the protective cover 11, the first cylindrical body 12, the plate spring 13, and the second cylindrical body 14 that are configured such that the resonant frequency of the protective cover vibration mode is larger than the resonant frequency of the piston vibration mode, and further includes the excitation circuit 2 that drives the plurality of piezoelectric elements 15. In a resonance system in which the resonant frequency of the protective cover 11 (the resonant frequency of the protective cover vibration mode) is equal to or more than about 1.2 times the resonant frequency of the plate spring 13 (the resonant frequency of the piston vibration mode), the excitation circuit 2 can selectively excite the resonance (the protective cover vibration) of the protective cover 11 and the resonance (the piston vibration) of the plate spring 13. That is, in the vibration device 10, it is possible to selectively switch the vibration mode between the protective cover vibration mode and the piston vibration mode. Accordingly, when the vibration device 10 uses the protective cover vibration mode, the foreign matter adhering to the protective cover 11 can be collected and atomized at the center or approximate center of the protective cover 11, and when the piston vibration mode is used, the foreign matter adhering to the protective cover 11 including that on the peripheral portion can be atomized there at one time. That is, in the vibration device 10, it is possible to remove the foreign matter adhering to the protective cover 11 while maintaining the field of view of the protective cover 11 by selectively using the vibration mode in accordance with the application. Further, the excitation circuit 2 drives the plurality of piezoelectric elements 15 so that the first cylindrical body 12 vibrates in a direction perpendicular or substantially perpendicular to the vibration direction of the second cylindrical body 14, such that the foreign matter adhering to the protective cover 11 can be removed while maintaining the field of view of the protective cover 11.

The protective cover 11 has a dome shape. Further, the thickness of the first cylindrical body 12 is shorter than a length from a position of the plate spring 13 supporting the first cylindrical body 12 to a position of the plate spring 13 supported by the second cylindrical body 14, such that the foreign matter adhering to the protective cover 11 can be removed while maintaining the field of view of the protective cover 11.

Preferred Embodiment 2

In the vibration device 10 according to Preferred Embodiment 1, it has been described that the dome-shaped protective cover 11 vibrates in the piston vibration mode. In Preferred Embodiment 2 of the present invention, a vibration device in a case where the protective cover is vibrated in the piston vibration mode as a plate having a plate shape will be described. Further, in Preferred Embodiment 2, a description will be provided of a vibration device in a case where the protective cover has a plate shape and the protective cover is vibrated to be inclined in the piston vibration mode. Note that the vibration device according to Preferred Embodiment 2 has the same or similar configuration as that of the vibration device 10 illustrated in FIG. 1, and the same reference numerals denote the same or corresponding components, and the detailed description thereof will not be repeated.

Figure 6A:
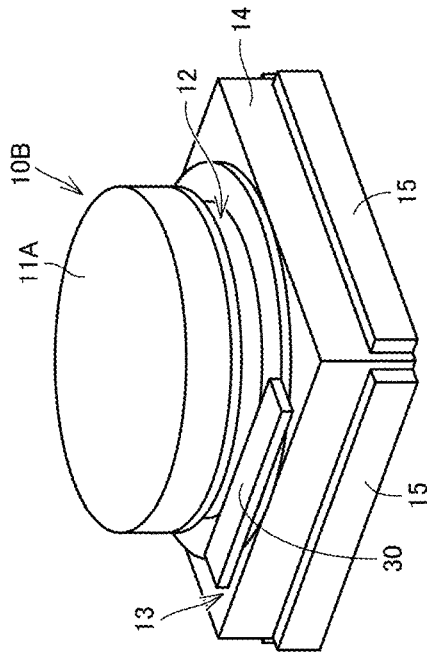
FIGS. 6A to 6D include diagrams for explaining a case where no weight is provided and a case where a weight is provided for comparison in a vibration device according to Preferred Embodiment 2 of the present invention.
Figure 6B:
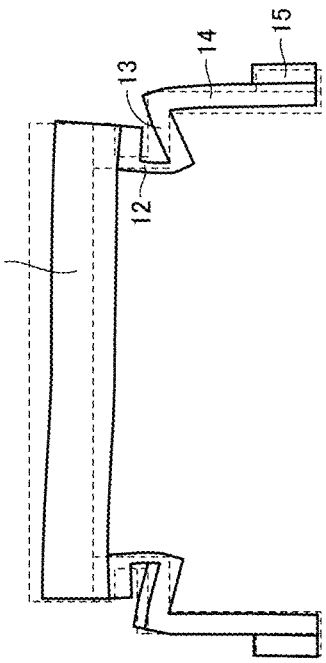
Figure 6C:
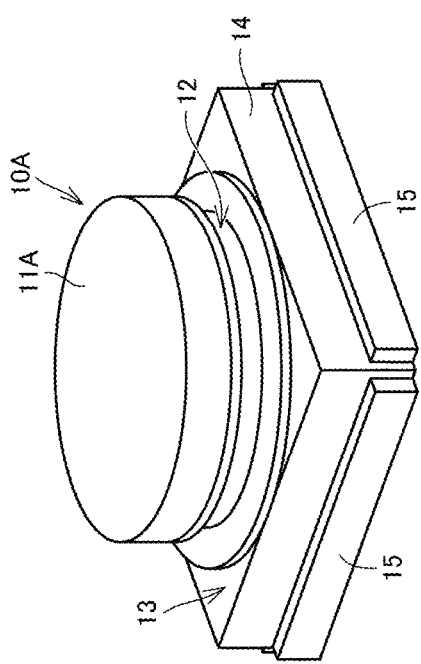
Figure 6D:
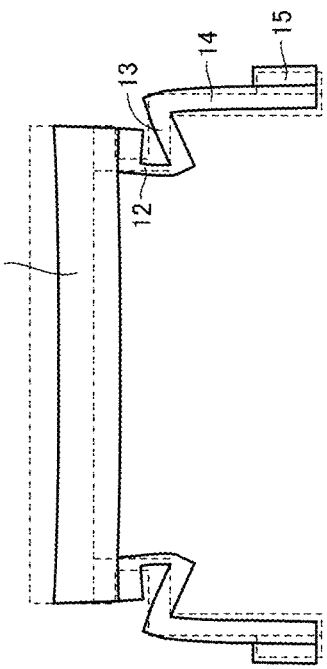

In Preferred Embodiment 2, a weight is disposed on a portion of a plate spring in order to vibrate the protective cover to be inclined in the piston vibration mode. In a case where the weight is not provided in a portion of the plate spring, the entirety of the vibration device according to Preferred Embodiment is uniformly displaced in the vertical direction without substantially deforming the protective cover itself as illustrated in FIG. 3A. Specifically, FIGS. 6A to 6D include diagrams for explaining a case where no weight is provided and a case where a weight is provided in vibration devices 10A and 10B according to Preferred Embodiment 2 for comparison. FIG. 6A illustrates the vibration device 10A in which the plate spring 13 is not provided with a weight 30 and including a plate-shaped protective cover 11A. FIG. 6B is a sectional view illustrating a vibration state of the vibration device 10A. FIG. 6C illustrates the vibration device 10B in which the plate-shaped protective cover 11A is provided, and a weight 30 is provided at an end portion of the plate spring 13. FIG. 6D is a sectional view illustrating a vibration state of the vibration device 10B.

The vibration device 10A without the weight 30 illustrated in FIG. 6A is the same or substantially the same as the vibration device 10 according to Preferred Embodiment 1, except that the protective cover plate-shaped. In FIG. 6B, the vibration device 10A vibrates the piezoelectric elements 15 provided on the side surfaces facing each other in the inward direction or the outward direction to or from each other. In the vibration device 10A, when the piezoelectric elements 15 vibrate in the outward direction from each other, the second cylindrical body 14 is displaced in the outward direction, and the position of the plate spring 13 supporting the first cylindrical body 12 sinks downward. When the position of the plate spring 13 sinks downward, the entirety of the first cylindrical body 12 is displaced downward, and the protective cover 11A held by the first cylindrical body 12 is also entirely displaced downward.

Although not illustrated, when the piezoelectric elements 15 vibrate in the inward direction to each other, the second cylindrical body 14 is displaced in the inward direction, and the position of the plate spring 13 supporting the first cylindrical body 12 rises upward. When the position of the plate spring 13 rises upward, the entirety of the first cylindrical body 12 is displaced upward, and the protective cover 11A held by the first cylindrical body 12 is also entirely displaced upward. Therefore, the entirety of the protective cover 11A is uniformly displaced in the vertical direction without substantially deforming the protective cover 11A itself due to the vibration of the piezoelectric element 15.

The vibration device 10B including the weight 30 illustrated in FIG. 6C has the same or similar configuration as that of the vibration device 10A without the weight 30, except that the weight 30 is attached to an upper surface of the plate spring 13. Note that the position of the weight 30 may be a position of a lower surface of the plate spring 13. In FIG. 6D, the vibration device 10B vibrates the piezoelectric elements 15 provided on the side surfaces facing each other in the inward direction or the outward direction to or from each other. In the vibration device 10B, when the piezoelectric elements 15 vibrate in the outward direction from each other, the second cylindrical body 14 is displaced in the outward direction, and the position of the plate spring 13 supporting the first cylindrical body 12 sinks downward. At this time, since the plate spring 13 on the side where the weight 30 is not disposed is displaced more than the plate spring 13 on the side where the weight 30 is disposed, the plate spring 13 on the side where the weight 30 is not disposed sinks more downward. As a result, the first cylindrical body 12 sinks to be inclined to the side where the weight 30 is not disposed. The protective cover 11A is in a non-equilibrium state of being displaced downward in the rightward direction from an equilibrium state in which the entirety is uniformly displaced due to the displacement difference of the first cylindrical body 12.

Although not illustrated, when the piezoelectric elements 15 vibrate in the inward direction to each other, the second cylindrical body 14 is displaced in the inward direction, and the position of the plate spring 13 supporting the first cylindrical body 12 rises upward. At this time, the plate spring 13 on the side where the weight 30 is not disposed is displaced more than the plate spring 13 on the side where the weight 30 is disposed, and thus the plate spring 13 on the side where the weight is not disposed rises more upward. As a result, the first cylindrical body 12 rises upward to be inclined to the side where the weight 30 is not disposed. The protective cover 11A is in the non-equilibrium state of being displaced upward in the rightward direction from the equilibrium state in which the entirety is uniformly displaced due to the displacement difference of the first cylindrical body 12.

Figure 7:
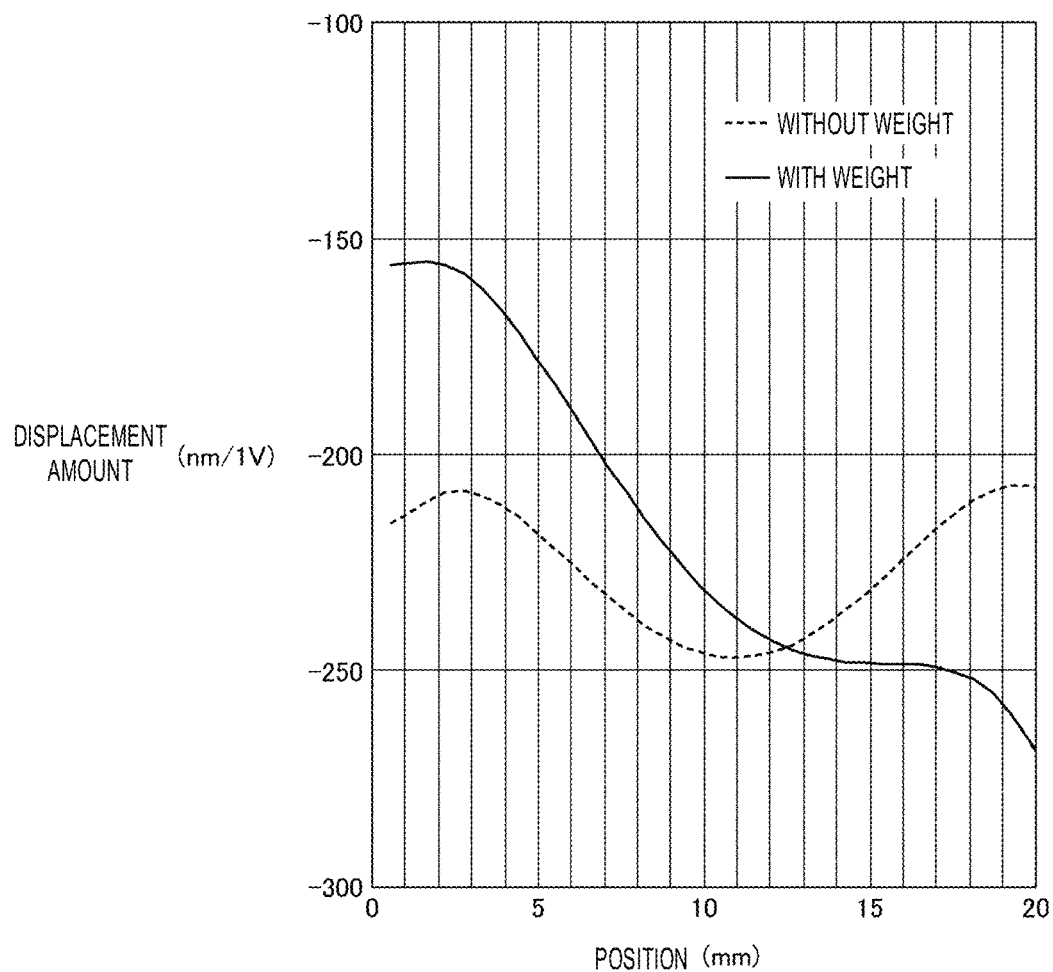
FIG. 7 is a graph showing a relationship between a position and an amount of displacement when a case where no weight is provided is compared with a case where a weight is provided in the vibration device according to Preferred Embodiment 2 of the present invention.

FIG. 7 is a graph showing a relationship between a position and an amount of displacement in a plane of the protective cover 11A when a case where no weight is provided is compared with a case where the weight is provided in the vibration device according to Preferred Embodiment 2. The position of 0 mm is a position of a left end of the protective cover 11A in FIGS. 6B and 6D. FIG. 7 illustrates the amount of displacement of the protective cover 11A in a state where the piezoelectric elements 15 are vibrated in the outward direction from each other. As shown in 7, in the vibration device 10A without the weight 30, an absolute value of the amount of displacement of the center in FIG. 6B is slightly larger than that of the amounts of displacement of the left and right ends, but the protective cover 11A is uniformly or substantially uniformly displaced downward. On the other hand, in the case where the weight 30 is provided, an absolute value of the amount of displacement on the side where the weight 30 is disposed in FIG. 6D is smaller than that of the amount of displacement in the case where the weight 30 is not provided. In the vibration device 10B including the weight 30, the absolute value of the amount of displacement increases toward a right end of the protective cover 11A, and exceeds that of the amount of displacement in the case where the weight 30 is not provided from around a position exceeding about 12.5 mm.

Although not illustrated, when the piezoelectric elements 15 are vibrated in the inward direction to each other, the amount of displacement of the protective cover 11A generates a graph, which is obtained by inverting the graph illustrated in FIG. 7 in the positive direction. According to such a relationship, the vibration device 10A without the weight 30 can atomize the foreign matter, such as raindrops or the like, for example, in situ without substantially moving the foreign matter. By vibrating the protective cover 11A to be inclined in the vertical direction, the vibration device 10B including the weight 30 discharges the foreign matter, such as raindrops or the like, for example, from the protective cover 11A and atomizes the foreign matter, such as raindrops or the like, for example, remaining on the protective cover 11A. As described above, the vibration devices 10A and 10B can move raindrops or the like regardless of the presence or absence of the weight 30 even when the vibration in the same piston vibration mode is generated. Accordingly, the imaging unit can change the vibration corresponding to characteristics of the imaging element arranged inside the vibration device depending on the presence or absence of the weight 30.

Figure 8A:
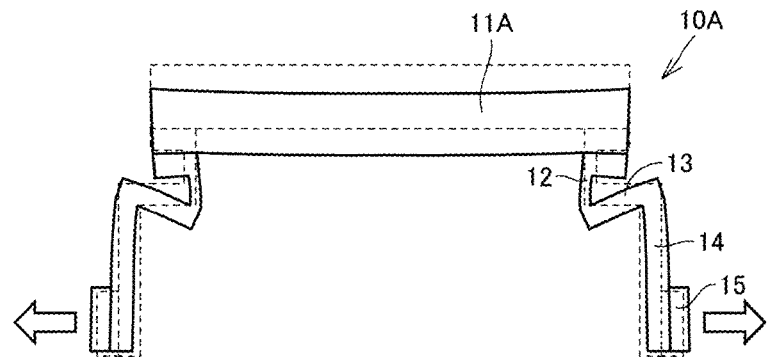
FIGS. 8A to 8C include schematic diagrams for explaining various vibration modes in the vibration device according to Preferred Embodiment 2 of the present invention.
Figure 8B:
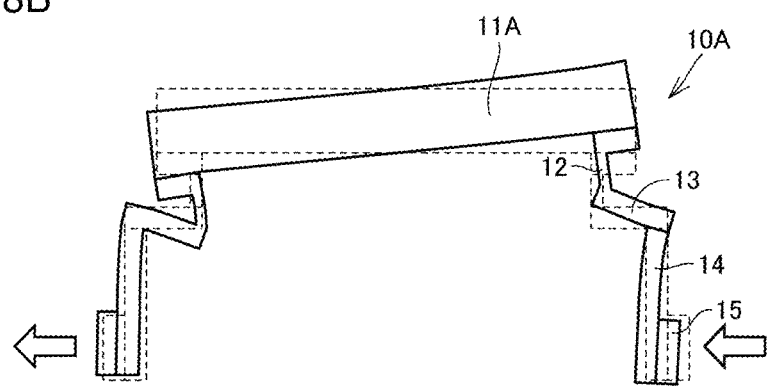
Figure 8C:
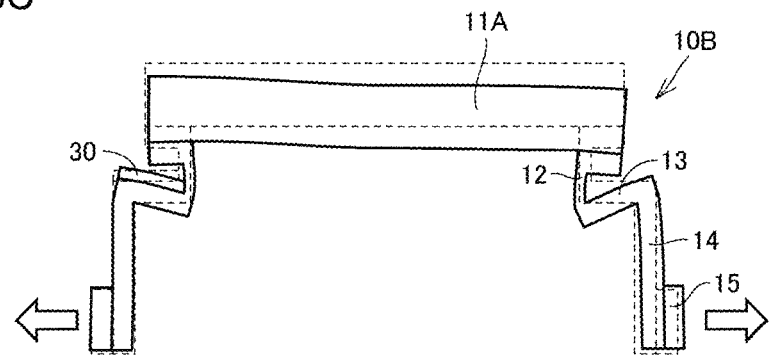

FIGS. 8A to 8C include schematic diagrams for explaining various vibration modes in the vibration devices 10A and 10B according to Preferred Embodiment 2. FIGS. 8A and 8B are diagrams illustrating the vibration device 10A in which the weight 30 is not provided, and FIG. 8C is a diagram illustrating the vibration device 10B in which the weight 30 is provided. In FIGS. 8A to 8C, the timing to vibrate the second cylindrical body 14 in the inward direction is an in-phase timing illustrated in FIGS. 8A and 8C and an anti-phase timing illustrated in FIG. 8B.

FIG. 8A illustrates vibration by the piston vibration mode in which the first cylindrical body 12 is vertically displaced in a uniform or substantially uniform manner by the in-phase vibration of the piezoelectric element 15 to the second cylindrical body 14, therefore the protective cover 11A is vertically displaced in a uniform or substantially uniform manner. FIG. 8B illustrates alternate displacement in which one of the first cylindrical body 12 is moved down and another is raised by the anti-phase vibration of the piezoelectric element 15 to the second cylindrical body 14, and the one is raised and the other is moved down. As described above, when one piezoelectric element 15 is vibrated in the outward direction and another piezoelectric element 15 is vibrated in the inward direction to be in opposite phase, the vibration device 10A performs vibration in a seesaw vibration mode in which ends of the protective cover 11A alternately move vertically. FIG. 8C illustrates vibration in the non-equilibrium state in which the weight 30 is provided on one of the plate spring 13, and one end of the first cylindrical body 12 is largely displaced by the in-phase vibration of the piezoelectric element 15 to the second cylindrical body 14. Note that the configuration of the weight 30 described in Preferred Embodiment 2 can also be applied to the vibration device 10 according to Preferred Embodiment 1.

As described above, in the vibration device according to Preferred Embodiment 2, the protective cover 11A has a plate shape. As illustrated in FIG. 8A, the excitation circuit 2 drives the plurality of piezoelectric elements 15 so that the timing to vibrate the second cylindrical body 14 in the inward direction is in phase, and vibrates the first cylindrical body 12 in the axial direction. At this time, the protective cover 11A vibrates in the piston vibration mode. Accordingly, the vibration devices 10A and 10B can remove the foreign matter adhering to the protective cover 11A while maintaining the field of view of the protective cover 11A.

Note that, as illustrated in FIG. 8B, the excitation circuit 2 drives the plurality of piezoelectric elements 15 so that the timing to vibrate the second cylindrical body 14 in the inward direction is in opposite phase, and can vibrate the first cylindrical body 12 in the axial direction. Accordingly, the protective cover 11A vibrates in the seesaw mode. As a result, the vibration device 10A can be vibrated in different modes by inverting the phase.

As illustrated in FIG. 8C, in the vibration device 10B, the weight 30 may be added to a portion of the plate spring 13. Accordingly, the protective cover 11A vibrates in the non-equilibrium piston vibration mode. It is possible to vibrate the protective cover 11A in the non-equilibrium manner due to a simple change in shape in which the weight 30 is disposed in a portion of the protective cover 11A.

In the vibration devices 10, 10A, and 10B according to the above-described preferred embodiments, the protective covers 11 and 11A, and the first cylindrical body 12 have a circular or substantially circular shape when the first cylindrical body 12 is viewed in the axial direction, and the plate spring 13 and the second cylindrical body 14 have a rectangular or substantially rectangular shape when the first cylindrical body 12 is viewed in the axial direction. However, at least one of the protective covers 11 and 11A, the first cylindrical body 12, the plate spring 13, and the second cylindrical body 14 may have a circular or substantially circular shape when the first cylindrical body 12 is viewed from the axial direction. In addition, at least one of the protective covers 11 and 11A, the first cylindrical body 12, the plate spring 13, and the second cylindrical body 14 may have a rectangular or substantially rectangular shape when the first cylindrical body 12 is viewed from the axial direction.

In the vibration device 10B according to the above-described preferred embodiment, the weight 30 is added to the plate spring 13. However, the weight 30 may be added to a portion of at least one of the protective cover 11A, the first cylindrical body 12, the second cylindrical body 14, the plate spring 13, and the piezoelectric element 15.

In the vibration device 10B according to the above-described preferred embodiment, in place of the weight 30, a cutout portion of at least one of the protective cover 11A, the first cylindrical body 12, the second cylindrical body 14, the plate spring 13, and the piezoelectric element 15 may be provided. In addition, instead of the cutout portion, a hole portion may be provided. Accordingly, the vibration device 10B can vibrate in the non-equilibrium state in which one end of the protective cover 11A is largely displaced.

The imaging unit 100 according to the above-described preferred embodiment may include a camera, a LiDAR, a Rader, and the like, for example. In addition, a plurality of imaging units may be provided side by side.

The imaging unit 100 according to the above-described preferred embodiment is not limited to the imaging unit provided in the vehicle, and can be applied to any imaging unit that includes a vibration device and an imaging element arranged so that a light transmissive body is in the field of view, and that needs to remove foreign matter on the light transmissive body.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A vibration device comprising:
   a light transmissive body to transmit light with a predetermined wavelength;
   a first cylindrical body to hold the light transmissive body at one end;
   a plate-shaped spring portion to support another end of the first cylindrical body;
   a second cylindrical body to support, at one end, a portion of the spring portion in an outer side portion that supports the first cylindrical body; and
   a plurality of vibrating bodies located on side surfaces of the second cylindrical body to vibrate in a direction perpendicular or substantially perpendicular to an axial direction of the second cylindrical body.

2. The vibration device according to claim 1, wherein
   a resonant frequency of the light transmissive body is larger than a resonant frequency of the spring portion;
   an excitation circuit to drive the plurality of vibrating bodies is included; and
   the excitation circuit selectively excites resonance of the light transmissive body and resonance of the spring portion.

3. The vibration device according to claim 2, wherein a resonant frequency of the light transmissive body is equal to or more than about 1.2 times a resonant frequency of the spring portion.

4. The vibration device according to claim 2, wherein the excitation circuit drives the plurality of vibrating bodies so that the first cylindrical body vibrates in a direction perpendicular or substantially perpendicular to a vibration direction of the second cylindrical body.

5. The vibration device according to claim 1, wherein at least one of the light transmissive body, the first cylindrical body, the spring portion, and the second cylindrical body has a circular or substantially circular shape when the first cylindrical body is viewed from an axial direction.

6. The vibration device according to claim 1, wherein at least one of the light transmissive body, the first cylindrical body, the spring portion, and the second cylindrical body has a rectangular or substantially rectangular shape when the first cylindrical body is viewed from an axial direction.

7. The vibration device according to claim 1, wherein the light transmissive body has a dome shape.

8. The vibration device according to claim 1, wherein the light transmissive body has a plate shape.

9. The vibration device according to claim 1, wherein a thickness of the first cylindrical body is shorter than a length from a position of the spring portion that supports the first cylindrical body to a position of the spring portion that is supported by the second cylindrical body.

10. The vibration device according to claim 2, wherein the excitation circuit drives the plurality of vibrating bodies so that a timing to vibrate the second cylindrical body in an inward direction is in phase, and vibrates the first cylindrical body in an axial direction of the first cylindrical body.

11. The vibration device according to claim 10, further comprising a cutout portion in at least one of the light transmissive body, the first cylindrical body, the second cylindrical body, the spring portion, and the vibrating body.

12. The vibration device according to claim 10, further comprising a weight that is added to a portion of at least one of the light transmissive body, the first cylindrical body, the second cylindrical body, the spring portion, and the vibrating body.

13. The vibration device according to claim 2, wherein the excitation circuit drives the plurality of vibrating bodies so that a timing to vibrate the second cylindrical body in an inward direction is in opposite phase, and vibrates the first cylindrical body in an axial direction of the first cylindrical body.

14. An imaging unit comprising:
   the vibration device according to claim 1; and
   an imaging element arranged such that the light transmissive body is in a field of view of the imaging element.

15. The imaging unit according to claim 14, wherein
   a resonant frequency of the light transmissive body is larger than a resonant frequency of the spring portion;
   an excitation circuit to drive the plurality of vibrating bodies is included; and
   the excitation circuit selectively excites resonance of the light transmissive body and resonance of the spring portion.

16. The imaging unit according to claim 15, wherein a resonant frequency of the light transmissive body is equal to or more than about 1.2 times a resonant frequency of the spring portion.

17. The imaging unit according to claim 15, wherein the excitation circuit drives the plurality of vibrating bodies so that the first cylindrical body vibrates in a direction perpendicular or substantially perpendicular to a vibration direction of the second cylindrical body.

18. The imaging unit according to claim 14, wherein at least one of the light transmissive body, the first cylindrical body, the spring portion, and the second cylindrical body has a circular or substantially circular shape when the first cylindrical body is viewed from an axial direction.

19. The imaging unit according to claim 14, wherein at least one of the light transmissive body, the first cylindrical body, the spring portion, and the second cylindrical body has a rectangular or substantially rectangular shape when the first cylindrical body is viewed from an axial direction.

20. The imaging unit according to claim 14, wherein the light transmissive body has a dome shape.

* * * * *